(12) United States Patent
Yang et al.

(10) Patent No.: US 7,335,588 B2
(45) Date of Patent: Feb. 26, 2008

(54) INTERCONNECT STRUCTURE AND METHOD OF FABRICATION OF SAME

(75) Inventors: Chih-Chao Yang, Poughkeepsie, NY (US); Lawrence A. Clevenger, La Grangeville, NY (US); Andrew P. Cowley, Wappingers Falls, NY (US); Timothy J. Dalton, Ridgefield, CT (US); Meeyoung H. Yoon, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 11/107,074

(22) Filed: Apr. 15, 2005

(65) Prior Publication Data

US 2006/0234497 A1 Oct. 19, 2006

(51) Int. Cl.
*H01L 24/4763* (2006.01)
(52) U.S. Cl. .............. 438/638; 438/637; 257/E21.579
(58) Field of Classification Search .............. 438/637, 438/638; 257/E21.579
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,197,681 B1* | 3/2001 | Liu et al. | 438/637 |
| 6,323,554 B1 | 11/2001 | Joshi et al. | |
| 6,342,733 B1 | 1/2002 | Hu et al. | |
| 6,365,506 B1* | 4/2002 | Chang et al. | 438/624 |
| 6,696,222 B2* | 2/2004 | Hsue et al. | 430/313 |
| 6,706,625 B1 | 3/2004 | Sudijono et al. | |
| 6,784,105 B1 | 8/2004 | Yang et al. | |
| 7,189,643 B2* | 3/2007 | Iba | 438/638 |
| 2003/0143856 A1* | 7/2003 | Givens et al. | 438/710 |
| 2004/0113279 A1 | 6/2004 | Chen et al. | |

\* cited by examiner

*Primary Examiner*—Michelle Estrada
(74) *Attorney, Agent, or Firm*—Schmeiser, Olsen & Watts; Robert M. Trepp (57) ABSTRACT

A damascene wire and method of forming the wire. The method including: forming a mask layer on a top surface of a dielectric layer; forming an opening in the mask layer; forming a trench in the dielectric layer where the dielectric layer is not protected by the mask layer; recessing the sidewalls of the trench under the mask layer; forming a conformal conductive liner on all exposed surface of the trench and the mask layer; filling the trench with a core electrical conductor; removing portions of the conductive liner extending above the top surface of the dielectric layer and removing the mask layer; and forming a conductive cap on a top surface of the core conductor. The structure includes a core conductor clad in a conductive liner and a conductive capping layer in contact with the top surface of the core conductor that is not covered by the conductive liner.

17 Claims, 10 Drawing Sheets

INTERCONNECT STRUCTURE AND METHOD OF FABRICATION OF SAME

FIELD OF THE INVENTION

The present invention relates to the field of integrated circuit manufacture; more specifically, it relates to an interconnect structure and method of fabricating the interconnect structure for wiring levels of an integrated circuit.

BACKGROUND OF THE INVENTION

Advanced integrated circuits utilize copper and other metallurgy in the interconnect or wiring levels in order to increase performance of the integrated circuit. Because of the possibility of copper and other metal diffusion through interlevel dielectric layers, copper and other metal interconnects are fabricated with conductive diffusion barrier liners on the sides and bottoms of the wires and dielectric copper and other metal diffusion barrier caps on the top surface of the wires. However, it has been found that wires using dielectric diffusion barrier caps are susceptible to reliability failures.

Therefore, there is a need for improved diffusion barrier capped interconnect structures.

SUMMARY OF THE INVENTION

The present invention utilizes electrically conductive diffusion barrier caps to seal surfaces of damascene and dual damascene interconnect structures not covered by electrically conductive liners or dielectric layers that may also act as diffusion barriers. The caps (and electrically conductive liners and dielectric layers, when acting as diffusion barrier) are diffusion barriers to a material contained in the core electrical conductor of a damascene or dual damascene line.

A first aspect of the present invention is a method, comprising: providing a substrate having a dielectric layer; forming a hard mask layer on a top surface of the dielectric layer; forming an opening in the hard mask layer; forming a trench in the dielectric layer where the dielectric layer is not protected by the hard mask layer, the trench having sidewalls and a bottom; recessing the sidewalls of the trench under the hard mask layer; forming a conformal electrically conductive liner on all exposed surfaces of the trench and the hard mask layer; filling the trench with a core electrical conductor; removing portions of the electrically conductive liner extending above the top surface of the dielectric layer and removing the mask layer; and forming an electrically conductive cap on a top surface of the core electrical conductor.

A second aspect of the present invention is a method comprising: providing a substrate having a dielectric layer; forming a hard mask layer on a top surface of the dielectric layer; forming an opening in the hard mask layer; forming a trench in the dielectric layer where the dielectric layer is not protected by the hard mask layer, the trench having sidewalls and a bottom, the sidewalls of the trench aligned with the opening in the hard mask; performing an isotropic etch of the sidewalls and bottom of the trench, the isotropic etch undercutting the hard mask layer and forming a hard mask overhang projecting over the trench; forming a conformal electrically conductive liner on all exposed surfaces of the trench and on all exposed surfaces of the hard mask layer, an upper portion of the electrically conductive liner in physical contact with the hard mask overhang and forming an electrically conductive overhang projecting over the trench; forming a core electrical conductor over the electrically conductive liner, the core electrical conductor filling the trench; performing a chemical-mechanical polish to remove the hard mask layer and all core electrical conductor extending above the top surface of the dielectric layer, the chemical-mechanical-polishing making coplanar a top surface of the dielectric layer, a top surface of the electrically conductive liner and a top surface of the core electrical conductor in the trench, the electrically conductive layer extending over and in direct physical contact with the core electrical conductor; and forming an electrically conductive cap on the top surface of the core electrical conductor.

A third aspect of the present invention is a structure, comprising: a core electrical conductor having a top surface, an opposite bottom surface and sides between the top and bottom surfaces; an electrically conductive liner in direct physical contact with and covering the bottom surface and the sides of the core electrical conductor, embedded portions of the electrically conductive liner in direct physical contact with and extending over the core electrical conductor in regions of the core electrical conductor adjacent to both the top surface and the sides of the core electrical conductor; and an electrically conductive cap in direct physical contact with the top surface of the core electrical conductor that is exposed between the embedded portions of the electrically conductive liner.

A fourth aspect of the present invention is a structure, comprising: a core electrical conductor having a top surface, an opposite bottom surface and sides between the top and bottom surfaces; a dielectric liner formed on the sides of the core electrical conductor; an electrically conductive liner in direct physical contact with and covering the bottom surface of the core electrical conductor and the dielectric liner, embedded portions of the electrically conductive liner extending over the dielectric liner and the core electrical conductor in regions of the core electrical conductor adjacent to both the top surface and the sides of the core electrical conductor; and an electrically conductive cap in direct physical contact with the top surface of the core electrical conductor that is exposed between the embedded portions of the electrically conductive liner.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of describing the present invention, the terms conductor and conductive should be reads as electrical conductor and electrically conductive.

A (single) damascene process is one in which wire trench or via openings are formed in a dielectric layer, an electrical conductor deposited on a top surface of the dielectric of sufficient thickness to fill the trenches and a chemical-mechanical-polish (CMP) process performed to remove excess conductor and make the surface of the conductor co-planer with the surface of the dielectric layer to form damascene wires (or damascene vias).

A dual damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor is deposited on a top surface of the dielectric of sufficient thickness to fill the trenches and via opening and a CMP process performed to make the surface of the conductor in the trench co-planer with the surface the dielectric layer to form dual damascene wire and dual damascene wires having integral dual damascene vias.

Figure 4:
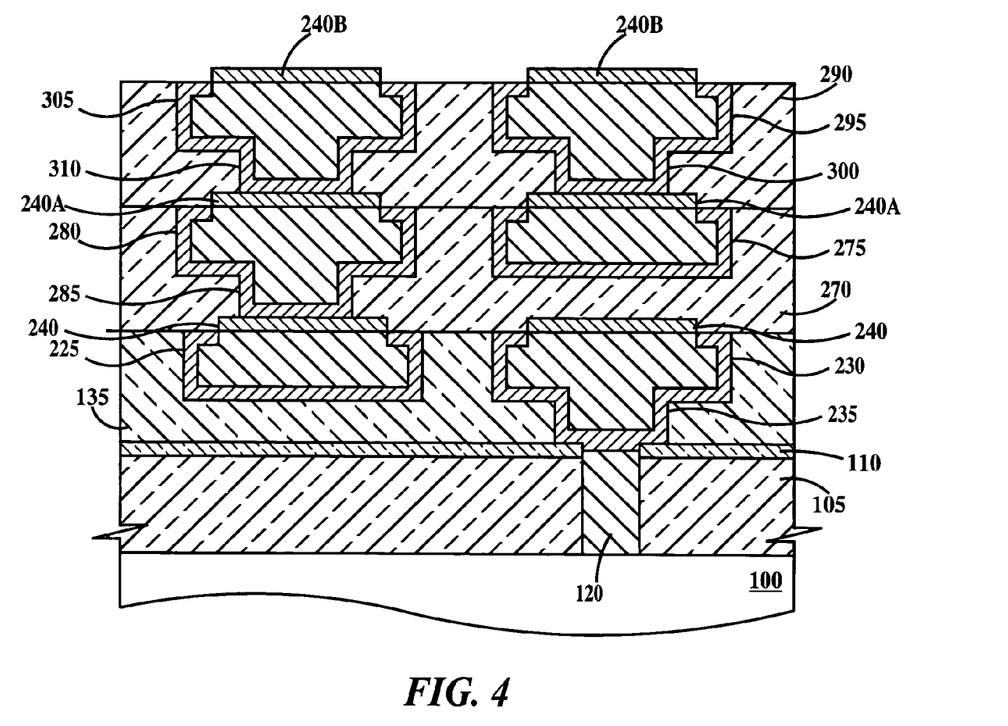
FIG. 4 is a cross-sectional view illustrating multiple wiring levels fabricated according to the first embodiment of the present invention.
Figure 5:
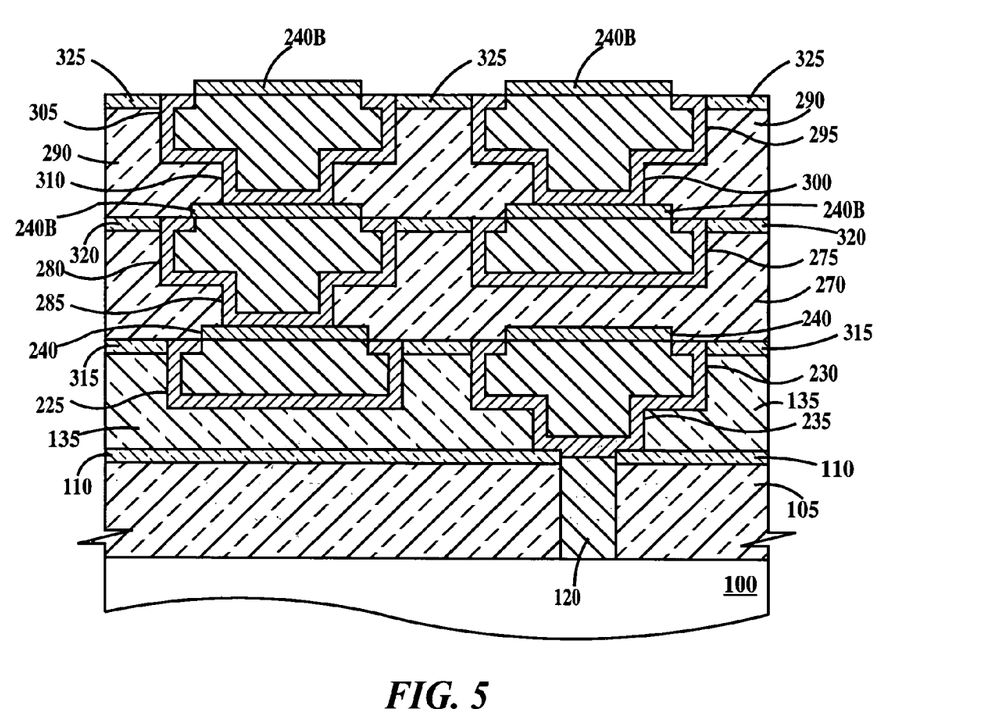
FIG. 5 is a cross-sectional view illustrating multiple wiring levels fabricated with additional diffusion barriers applicable to the first and the second embodiments of the present invention.

The structure of present invention will be described as being fabricated to connect to a contact level of an integrated circuit chip using a dual damascene process copper metallurgy process, though the present invention is applicable to metallurgies other than copper. A contact level is a transitional level, connecting devices such as metal-oxide-silicon field effect transistors (MOSFETs) to the first of wiring level of an integrated circuit, where the individual devices are "wired" into circuits. It should be understood that the structure of the present invention may be formed in any or all of these wiring levels as illustrated in FIGS. 4 and 5 and as well as using a single damascene process.

Figure 1A:
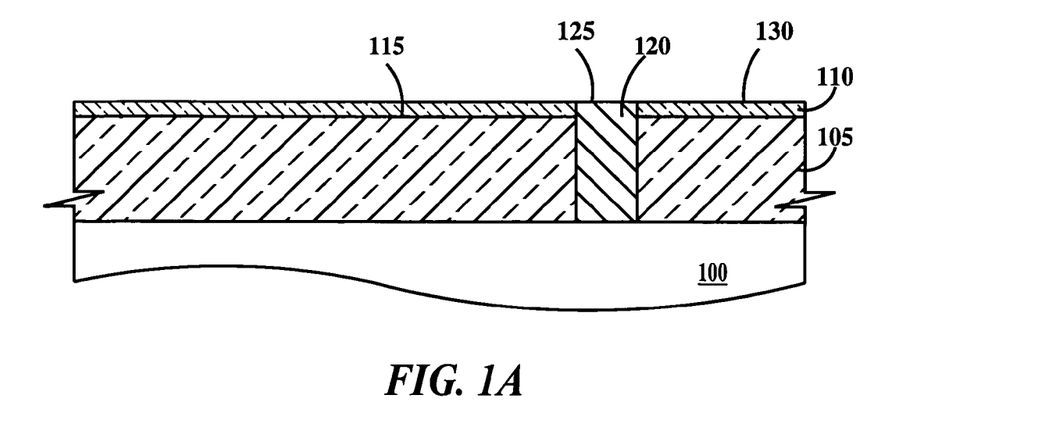
FIGS. 1A through 1H are cross-sectional views illustrating common process steps for fabricating an interconnect structure according to both first and second embodiments of the present invention.

FIGS. 1A through 1H are cross-sectional views illustrating common process steps for fabricating an interconnect structure according to both first and second embodiments of the present invention. In FIG. 1A, formed on a substrate 100 is a dielectric layer 105. A dielectric diffusion barrier 110 is formed on a top surface 115 of dielectric layer 105. Formed through diffusion barrier 110 and dielectric layer 105 is a stud contact 120. A top surface 125 of stud contact 120 is coplanar with a top surface 130 of barrier layer 110. In one example, barrier 110 is a diffusion barrier to materials contained in subsequently formed wires. In one example, barrier 110 is a diffusion barrier to copper.

Figure 1B:
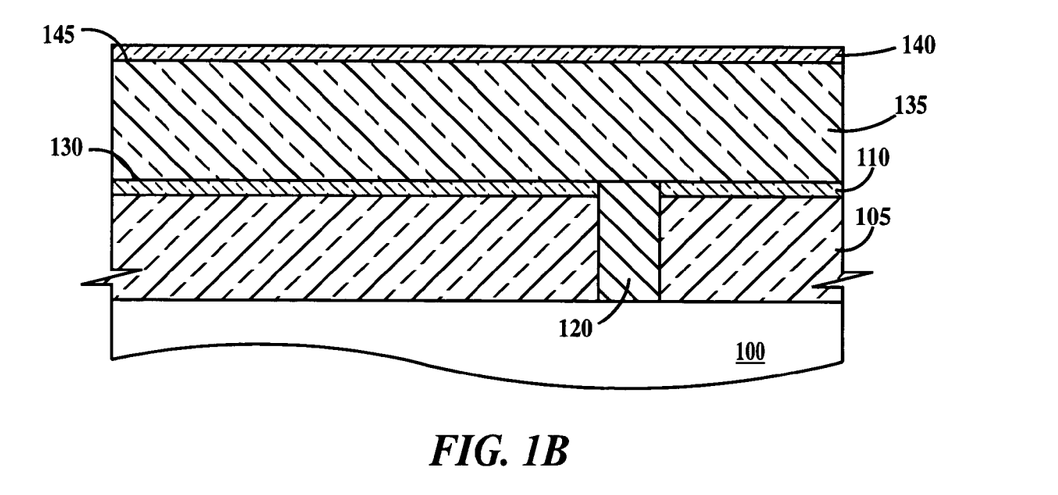

In FIG. 1B, a dielectric layer 135 is formed on top surface 130 of barrier layer 110 and a hard mask layer 140 is formed on a top surface 145 of dielectric layer 135. In one example, dielectric layer 135 is a low K (dielectric constant) material, examples of which include but are not limited to hydrogen silsesquioxane polymer (HSQ), methyl silsesquioxane polymer (MSQ) and polyphenylene oligomer ($SiO_x(CH_3)_y$). A low K dielectric material has a relative permittivity of about 4 or less. In a second example, dielectric layer 135 comprises $SiO_2$. Dielectric layer 135 may be, for example, between about 50 nm and about 1,000 nm thick. In one example, hard mask layer 140 may comprise, for example, silicon dioxide ($SiO_2$), silicon nitride ($Si_3N_4$), silicon carbide (SiC), silicon oxy nitride (SiON), silicon oxy carbide (SiOC), hydrogen doped silica glass (SiCOH), plasma-enhanced silicon nitride ($PSiN_x$) or NBLoK (SiC(N,H)). Hard mask layer 140 may be, for example, between about 5 nm and about 100 nm thick. It is possible for hard mask layer 140 to comprise a metal.

Figure 1C:
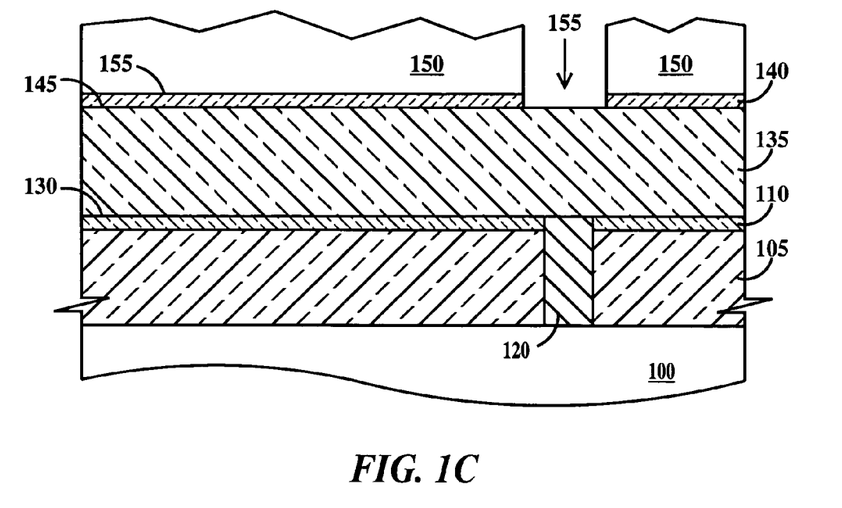

In FIG. 1C, a patterned photoresist layer 150 is formed on a top surface 155 of hard mask layer 140, the photoresist is layer patterned by any number of well known lithographic processes and a trench 155 etched through hard mask layer 140, exposing top surface 145 of dielectric layer 140.

Figure 1D:
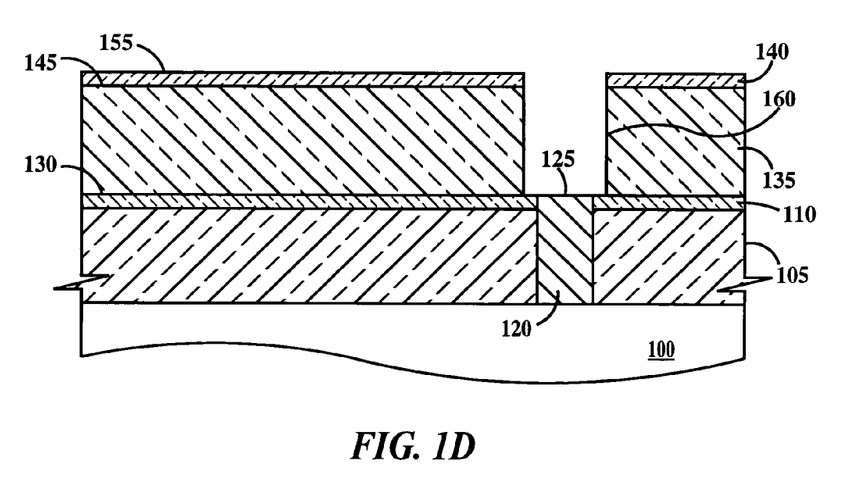

In FIG. 1D, patterned photoresist layer 150 (see FIG. 1C) is removed and a trench 160 is formed, for example using a reactive ion etch (RIE) process, into dielectric layer 135 to expose top surface 125 of stud contact 120 using patterned hard mask layer 140 as an etch mask.

Figure 1E:
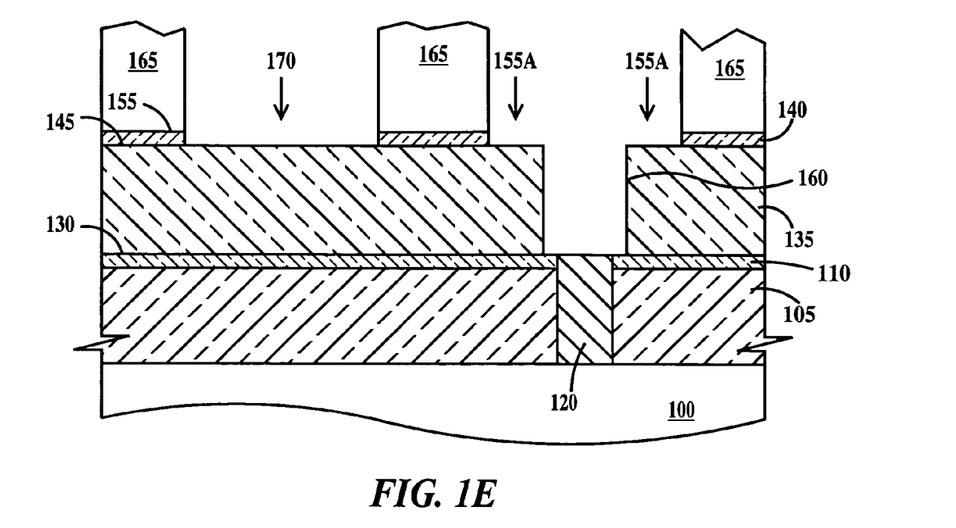

In FIG. 1E, another patterned photoresist layer 165 is formed on a top surface 155 of hard mask layer 140, the photoresist is layer patterned by any number of well known lithographic processes and trenches 155A (trench 155 of FIG. 1C widened) and 170 are etched through hard mask layer 140, exposing top surface 145 of dielectric layer 140.

Figure 1F:
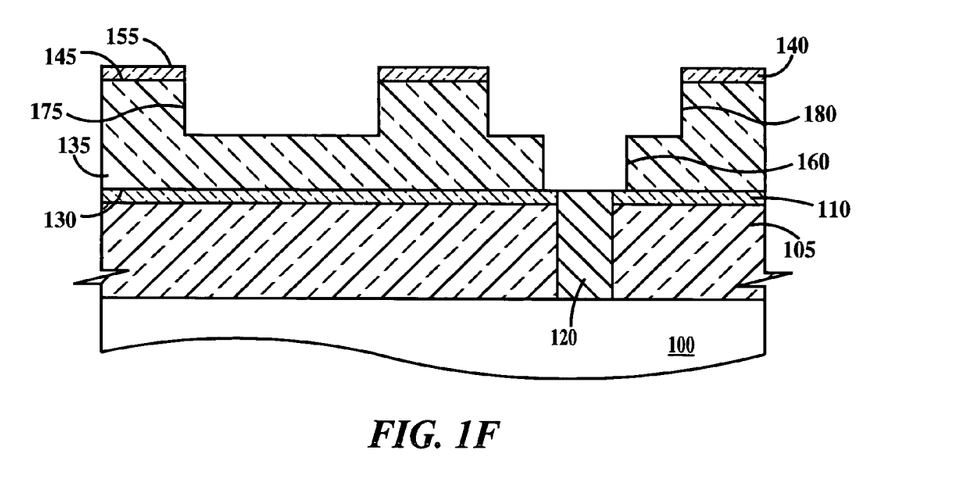

In FIG. 1F, patterned photoresist layer 165 (see FIG. 1E) is removed and a trenches 175 and 180 are etched, for example using an RIE process, part way into dielectric layer 135. Trench 180 intersects trench 160.

Figure 1G:
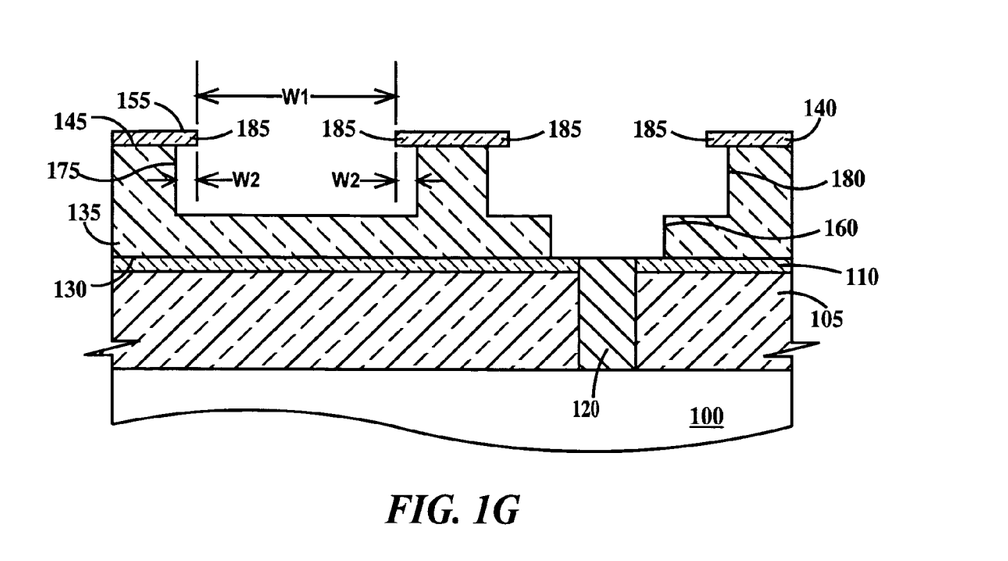

In FIG. 1G, overhangs 185 of hard mask layer 140 are created by isotropic removal of a layer of dielectric layer 135 exposed in trenches 160, 175 and 180. In a first example, the isotropic removal of a layer of dielectric layer 135 may be accomplished by wet etching in solution comprising $HNO_3$, HCl, $H_2SO_4$, HF, $NH_4OH$, $NH_4F$ or combinations thereof. In a second example, the isotropic removal of a layer of dielectric layer 135 may be accomplished by a high-pressure plasma etch having low directionality.

Using trench 175 as an example, if the widest portion of the opening in hard mask layer 140 is W1, and the overhang has a width W2, then the ratio W2/W1 may be between about 0.03 and about 0.48

Figure 1H:
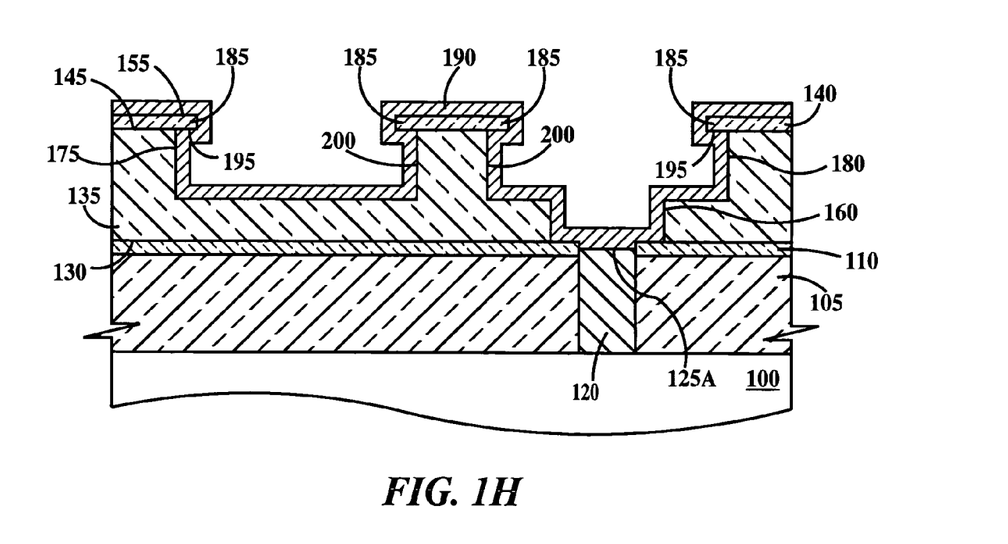

In FIG. 1H, a conformal conductive liner 190 is formed over top surface 155 of hard mask layer 140, all exposed surfaces of overhangs 185, including bottom surfaces 195 of the overhangs, exposed surfaces 200 of trenches 160, 175 and 180, and a top surface 125A of stud contact 120. In one example, liner 190 is a diffusion barrier to the material(s) of a core conductor 210 (see FIG. 2A or 3C) that will be later formed over the liner. In one example, liner 190 is a diffusion barrier to copper. In one example liner 190 comprises Ta, TaN, Ti, TiN, TiSiN, W, Ru or combinations thereof. In one example, liner 190 is between about 2 nm and about 100 nm thick. Liner 190 may be formed, for example by chemical vapor deposition (CVD) or atomic layer deposition (ALD).

Alternatively, liner 190 may be formed in a process of conformal deposition of liner material followed by a simultaneous sputter etch (using a charged sputtering species) and liner deposition as metal neutrals process as taught in U.S. Pat. No. 6,784,105 to Yang et al., issued on Aug. 31, 2004 which is hereby incorporated by reference in its entirety. In one example, metal neutrals comprises include Ta, TaN, Ti, TiN, TiSiN, W, Ru or combinations thereof and the gas used to generate the sputtering species comprises Ar, He, Ne, Xe, $N_2$, $H_2NH_3$, $N_2H_2$ or combinations thereof. The liner material previously deposited is removed from the bottom of the trench along with any metal oxide that may be present on top surface 125A of stud contact 120 (or any core conductor as illustrated in FIGS. 5 and 6). When sputtering is stopped but metal neutral deposition continued, a new layer of liner 190 is formed to replace that which was removed.

Figure 2A:
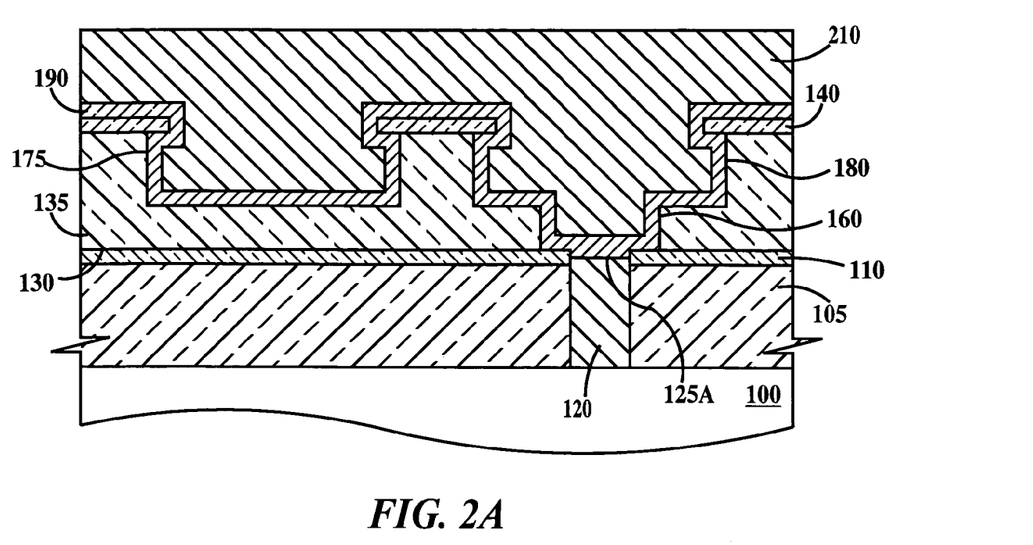
FIGS. 2A through 2C are cross-sectional views illustrating process steps for fabricating an interconnect structure according to the first embodiment of the present invention.
Figure 2B:
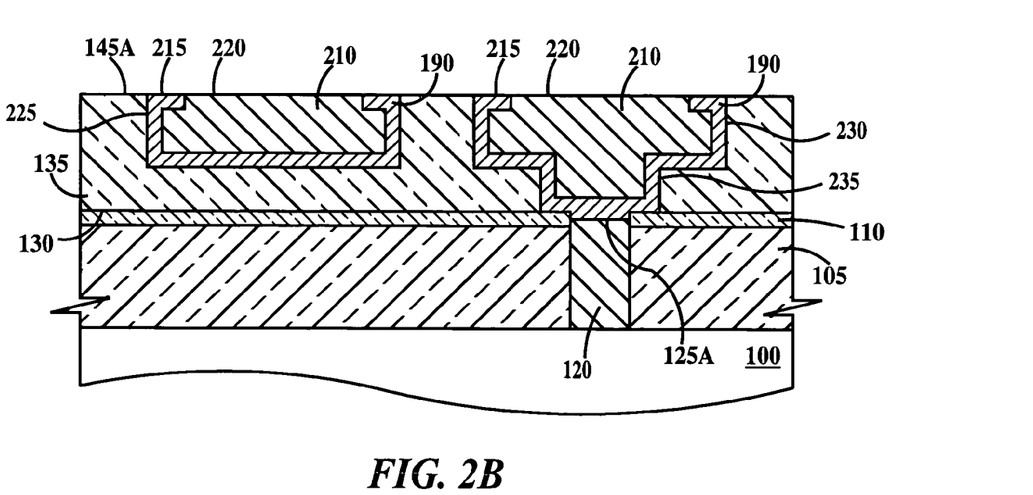
Figure 2C:
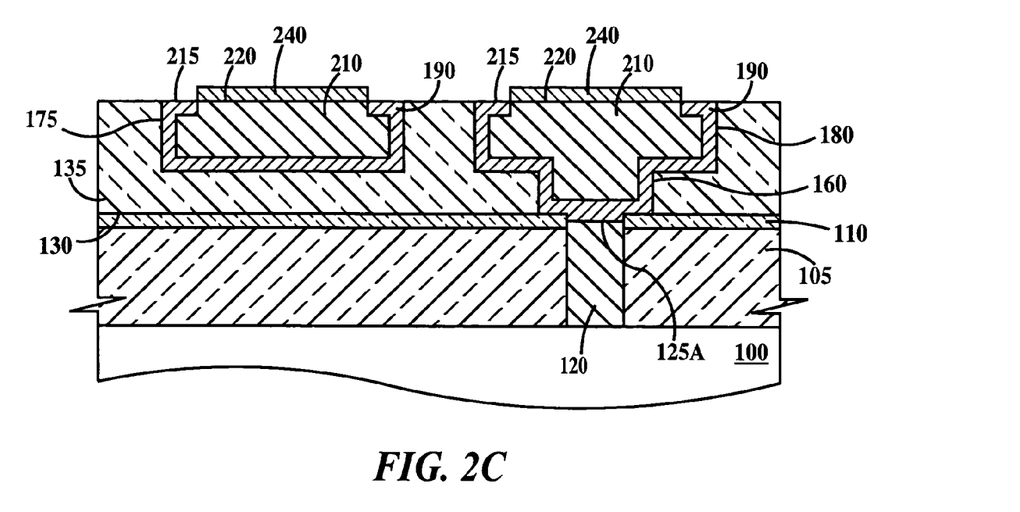

FIGS. 2A through 2C are cross-sectional views illustrating process steps for fabricating an interconnect structure according to the first embodiment of the present invention. FIG. 2A continues from FIG. 1H. In FIG. 2A, a core conductor 210 is formed on top of liner 190. In one example core conductor 210 comprises Al, AlCu, Cu, W, Ag, Au or combinations thereof. In the example of core conductor 210 being copper, a thin copper layer is evaporated or deposited and then a thicker layer of copper is electroplated. The thickness of core conductor 210 is sufficient to completely fill trenches 160, 175 and 180.

In FIG. 2B, a chemical-mechanical-polish (CMP) process is performed to co-planarize a top surface 145A of dielectric layer 135, a top surface 215 of liner 190 and a top surface 220 of core conductor 210. After the CMP process, a damascene wire 225 and a dual damascene wire 230 having with an integral damascene via 235 are formed.

In FIG. 2C, conductive diffusion barrier caps 240 are selectively formed on top surface 220 of core conductor 210. In one example, barrier caps 240 comprises CoWP, CoSnP, CoP and Pd or combinations thereof. In one example caps 240 are about 5 nm to about 80 nm thick. In one example, caps 240 are diffusion barriers to the material(s) of core conductor 210. In one example, caps 240 is a diffusion barrier to copper In one example, caps 240 are formed by a process that includes electroless plating. Methods of forming CoWP, CoSnP, CoP and Pd layers are disclosed in U.S. Pat. No. 5,695,810 to Bubin et al, issued on Dec. 9, 1997 and U.S. Pat. No. 6,342,733 to Hu et al., issued on Jan. 29, 2002 which are hereby incorporated by reference in their entireties. Barrier caps 240 are in direct physical contact with top surface 220 of core conductor 210.

Figure 3A:
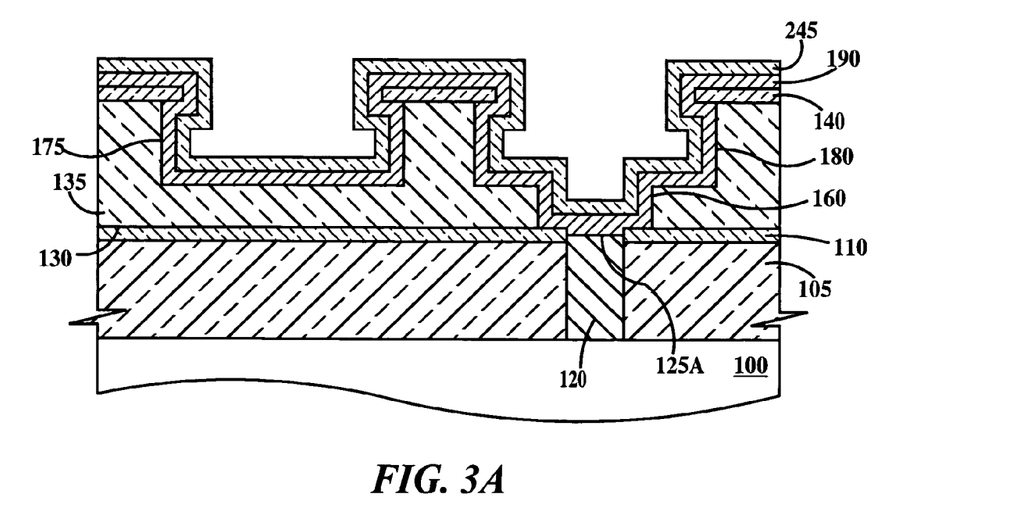
FIGS. 3A through 3E are cross-sectional views illustrating process steps for fabricating an interconnect structure according to the second embodiment of the present invention.

FIGS. 3A through 3E are cross-sectional views illustrating process steps for fabricating an interconnect structure according to the second embodiment of the present invention. FIG. 3A continues from FIG. 1H. In FIG. 3A a dielectric liner 245 is formed on all exposed surfaces of liner 190. In one example, dielectric liner 245 may comprise, for example, silicon dioxide ($SiO_2$), silicon nitride ($Si_3N_4$), silicon carbide (SiC), silicon oxy nitride (SiON), silicon oxy carbide (SiOC), hydrogen doped silica glass (SiCOH), plasma-enhanced silicon nitride ($PSiN_x$) or NBLoK (SiC(N, H)) or combinations thereof. In one example dielectric liner 245 is about 5 nm to about 100 nm thick. Dielectric liner 245 may be formed, for example by CVD or ALD.

Figure 3B:
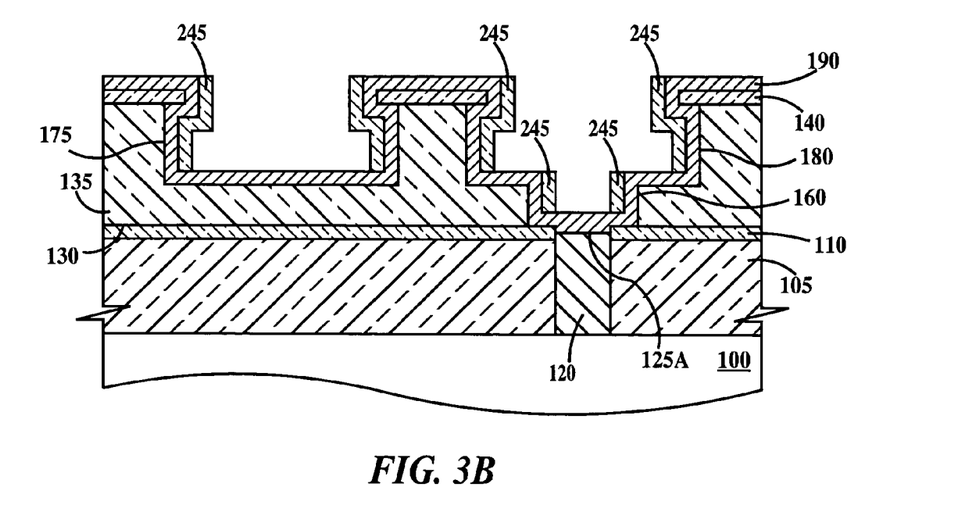

In FIG. 3B, a directional etch process (such as an RIE) is performed to remove dielectric liner 245 from horizontal surfaces of liner 190 disposed on bottom surfaces of trenches 160. 175 and 180. The directional etch process may be followed by a simultaneous sputter etch and liner deposition as metal neutrals process as described supra, in reference to FIG. 1H.

Figure 3C:
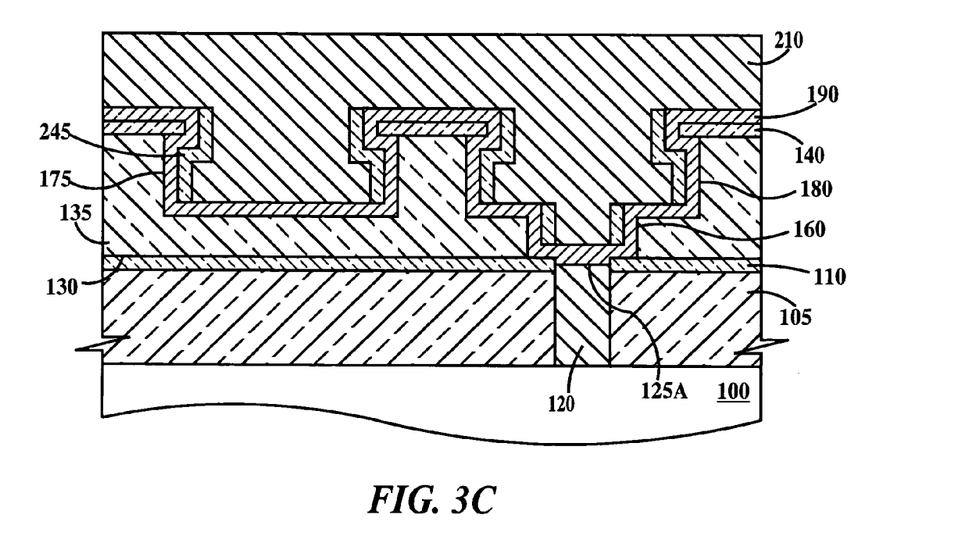

In FIG. 3C, core conductor 210 is formed as described supra ion reference to FIG. 2A. The thickness of core conductor 210 is sufficient to completely fill trenches 160, 175 and 180.

Figure 3D:
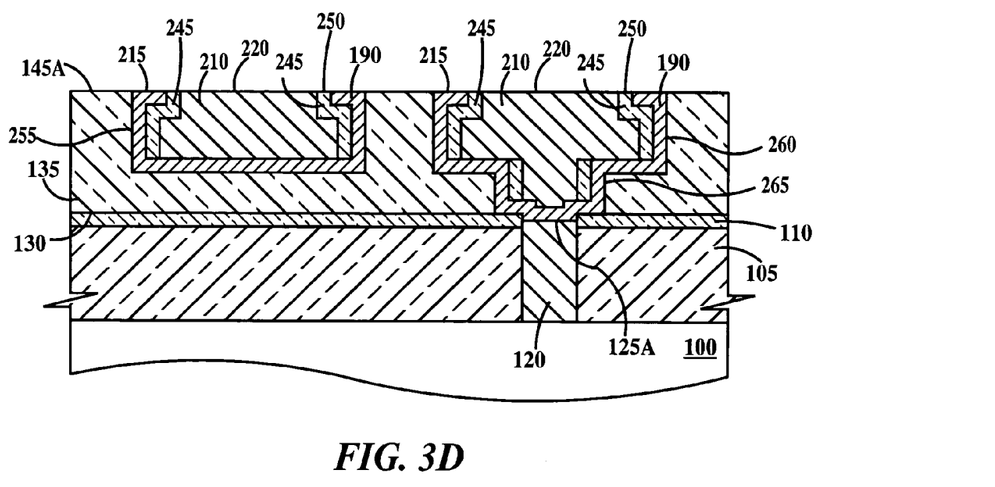

In FIG. 3D, a CMP process is performed to co-planarize top surface 145A of dielectric layer 135, top surface 215 of liner 190, top surface 220 of core conductor 210 and a top surface 250 of dielectric liner 245. After the CMP process, a damascene wire 255 and a dual damascene wire 260 having with an integral damascene via 265 are formed.

Figure 3E:
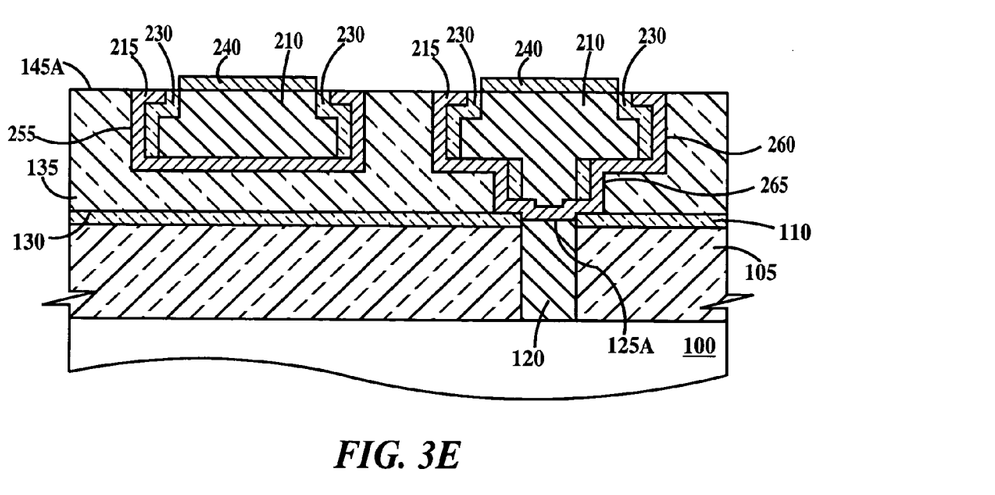

In FIG. 3E, caps 240 are selectively formed on top surface 220 of core conductor 210. Caps 240 are in direct physical contact with and completely covers top surface 220 of core conductor 210.

FIG. 4 is a cross-sectional view illustrating multiple wiring levels fabricated according to the first embodiment of the present invention. In FIG. 4, an interlevel dielectric layer 270 containing a damascene wire 275 and dual damascene wire 280 having with an integral damascene via 285 is formed over dielectric layer 135 (which can also be considered an interlevel dielectric layer). An interlevel dielectric layer 290 containing a dual damascene wire 295 with an integral damascene via 300 and dual damascene wire 305 having with an integral damascene via 310 is formed over interlevel dielectric layer dielectric layer 270. Interlevel dielectric layers 270 and 275 are similar to dielectric layer 135. Damascene wire 275 is similar to damascene wire 225 and dual damascene wires 280, 295 and 305 with respective integral vias 285, 300 and 310 are similar to dual damascene wire 230 and integral via 235. Caps 240A and 240B are similar to caps 240. While three wiring levels are illustrated in FIG. 4, any number of similar wiring levels may be so stacked. Damascene wires and vias and dual damascene wires and vias having structures of the second embodiment of the present invention may be similarly formed in stacked interlevel dielectric layers.

FIG. 5 is a cross-sectional view illustrating multiple wiring levels fabricated with additional diffusion barriers applicable to the first and the second embodiments of the present invention. FIG. 5 is similar to FIG. 4 with the difference that a dielectric layer 135A includes dielectric layer 135 and a dielectric diffusion barrier 315, an interlevel dielectric layer 270A includes dielectric layer 270 and a dielectric diffusion barrier layer 320 and an interlevel dielectric layer 290A includes dielectric layer 290 and a dielectric diffusion barrier layer 325. Diffusion barrier 315 is formed between dielectric layer 135 and interlevel dielectric layer 275, diffusion barrier 320 is formed on top of interlevel dielectric layer 275. Diffusion barriers 315, 320 and 325 are similar to diffusion barrier 110. In one example, diffusion barriers 315, 320 and 325 are diffusion barriers to materials contained in wires 225, 230, 275, 280, 295 and 305. In one example, diffusion barriers 315, 320 and 325 are diffusion barriers to copper. While three wiring levels are illustrated in FIG. 5, any number of similar wiring levels may be so stacked. Damascene wires and vias and dual damascene wires and vias having structures of the second embodiment of the present invention may be similarly formed in stacked interlevel dielectric layers.

Thus, the present invention provides improved diffusion barrier capped interconnect structures.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:

providing a substrate having a dielectric layer;

forming a hard mask layer on a top surface of said dielectric layer;

forming an opening in said hard mask layer;

forming a trench in said dielectric layer where said dielectric layer is not protected by said hard mask layer said trench having sidewalls and a bottom;

recessing said sidewalls of said trench under said hard mask layer;

forming a conformal electrically conductive liner on all exposed surface of said trench and said hard mask layer;

forming a dielectric liner on said electrically conductive liner where said electrically conductive liner is in contact with said sidewalls of said trench;

filling said trench with a core electrical conductor;

removing portions of said electrically conductive liner extending above said top surface of said dielectric layer and removing said mask layer;

forming an electrically conductive cap on a top surface of said core electrical conductor;

before said filling said trench with said core electrical conductor, forming a dielectric liner on exposed surfaces of said electrically conductive liner; and removing said dielectric liner from surfaces of said electrically conductive liner where said electrically conductive liner is in contact with said bottom surface of said trench.

2. The method of claim 1, wherein said electrically conductive liner and said electrically conductive cap are diffusion barriers to one or more materials said core electrical conductor is comprised of.

3. The method of claim 1, wherein said hard mask layer comprises a material selected from the group consisting of $SiO_2$, $Si_3N_4$, SiC, SiON, SiOC, SiCOH, $PSiN_x$ and SiC(N, H).

4. The method of claim 1, wherein said dielectric layer comprises a material selected from the group consisting of a dielectric material having a relative permittivity of about 4 or less, hydrogen silsesquioxane polymer, methyl silsesquioxane polymer, polyphenylene oligomerm, $SiO_2$ and combinations thereof.

5. The method of claim 1, wherein said electrically conductive liner comprises a material selected from the group consisting of Ta, TaN, Ti, TiN, TiSiN, W, Ru and combinations thereof.

6. The method of claim 1, wherein said core electrical conductor comprises a material selected from the group consisting of Al, AlCu, Cu, W, Ag, Au and combinations thereof.

7. The method of claim 1, wherein said electrically conductive cap comprises a material selected from the group consisting of CoWP, CoSnP, CoP, Pd or combinations thereof.

8. The method of claim 1, wherein said dielectric layer comprises a first dielectric layer formed on a top surface of a second dielectric layer, said first dielectric layer being a diffusion barrier to one or more materials said core electrical conductor is comprised of.

9. The method of claim 1, wherein said forming an electrically conductive cap includes an electroless plating of at least a portion of said electrically conductive cap.

10. A method comprising:

providing a substrate having a dielectric layer;

forming a hard mask layer on a top surface of said dielectric layer;

forming an opening in said hard mask layer;

forming a trench in said dielectric layer where said dielectric layer is not protected by said hard mask layer, said trench having sidewalls and a bottom, said sidewalls of said trench aligned with said opening in said hard mask;

performing an isotropic etch of said sidewalls and bottom of said trench, said isotropic etch undercutting said hard mask layer and forming a hard mask overhang projecting over said trench;

forming a conformal electrically conductive liner on all exposed surfaces of said trench and on all exposed surfaces of said hard mask layer, an upper portion of said electrically conductive liner in physical contact with said hard mask overhang and forming an electrically conductive overhang projecting over said trench;

forming a core electrical conductor over said electrically conductive liner, said core electrical conductor filling said trench;

performing a chemical-mechanical polish to remove said hard mask layer and all core electrical conductor extending above said top surface of said dielectric layer, said chemical-mechanical-polishing making coplanar a top surface of said dielectric layer, a top surface of said electrically conductive liner and a top surface of said core electrical conductor in said trench, said electrically conductive layer extending over and in direct physical contact with said core electrical conductor; and forming an electrically conductive cap on said top surface of said core electrical conductor.

11. The method of claim 10, further including:

forming a dielectric liner on exposed surfaces of said electrically conductive liner; and removing said dielectric liner from surfaces of said electrically conductive liner where said electrically conductive liner is in contact with said bottom surfaces of said trench.

12. The method of claim 10, wherein said forming a conformal electrically conductive liner includes:

simultaneously depositing and sputter etching a metal layer on said sidewalls of said trench.

13. The method of claim 12, wherein said forming a conformal electrically conductive liner further includes depositing another metal layer on said metal layer on said sidewalls of said trench after said simultaneously depositing and sputter etching.

14. The method of claim 10, wherein said electrically conductive liner and said electrically conductive cap are diffusion barriers to one or more materials said core electrical conductor is comprised of.

15. The method of claim 10, wherein said forming an electrically conductive cap includes an electroless plating of at least a portion of said electrically conductive cap.

16. The method of claim 10, wherein said dielectric layer comprises a first dielectric layer formed on a top surface of a second dielectric layer, said first dielectric layer being a diffusion barrier to one or more materials said core electrical conductor is comprised of.

17. The method of claim 10, wherein:

said electrically conductive liner comprises a material selected from the group consisting of Ta, TaN, Ti, TiN, TiSiN, W, Ru and combinations thereof;

said core electrical conductor comprises a material selected from the group consisting of Al, AlCu, Cu, W, Ag, Au and combinations thereof; and said electrically conductive cap comprises a material selected from the group consisting of CoWP, CoSnP, CoP, Pd or combinations thereof.

* * * * *

UNITED STATES PATENT AND TRADEMARK OFFICE
CERTIFICATE OF CORRECTION

PATENT NO. : 7,335,588 B2
APPLICATION NO. : 11/107074
DATED : February 26, 2008
INVENTOR(S) : Yang et al.

It is certified that error appears in the above-identified patent and that said Letters Patent is hereby corrected as shown below:

Column 7
Line 4, delete "surface" and insert -- surfaces --
Line 16, delete "a" and insert -- said --

Signed and Sealed this

Twenty-sixth Day of August, 2008

JON W. DUDAS
*Director of the United States Patent and Trademark Office*